United States Patent [19]

Tzeng

[11] Patent Number: 5,199,001
[45] Date of Patent: Mar. 30, 1993

[54] ARCHITECTURE FOR ERASING VERY SMALL AREAS OF FLASH EPROMS

[75] Inventor: Jyh-Cherng J. Tzeng, Sunnyvale, Calif.

[73] Assignee: Intel Corporation, Santa Clara, Calif.

[21] Appl. No.: 604,947

[22] Filed: Oct. 29, 1990

[51] Int. Cl.$^5$ .......................................... G11C 13/00
[52] U.S. Cl. .................................... 365/218; 365/182
[58] Field of Search .................. 365/185, 182, 189.01, 365/218

[56] References Cited

U.S. PATENT DOCUMENTS

| | | |
|---|---|---|
| 4,161,039 | 7/1979 | Rossler . |
| 4,203,158 | 5/1980 | Forhman-Bentchkowsky . |
| 4,258,378 | 3/1981 | Wall . |
| 4,266,283 | 5/1981 | Perlegos et al. . |
| 4,366,555 | 12/1982 | Hu . |
| 4,467,453 | 8/1984 | Chiu et al. . |
| 4,532,535 | 7/1985 | Gerber et al. . |

OTHER PUBLICATIONS

Ohya et al., "Single 5V Eprom with Sub-Micron Memory Transistor and On-Chip High Voltage Generator", NEC Corporation, Sagamihara, Kanagawa 229, Japan, pp. 570–573.

Endoh et al., "New Design Technology for Eeprom Memory Cells with 10 Million Write/Erase Cycling Endurance", ULSI Research Center, Toshiba Corporation, pp. 599–602.

*Primary Examiner*—Terrell W. Fears
*Attorney, Agent, or Firm*—Blakely, Sokoloff, Taylor & Zafman

[57] ABSTRACT

An electrically programmable memory array including a plurality of memory cells for storing data aligned in rows and columns, a plurality of word lines each connected to the gate terminals of the memory cells in a particular row, a plurality of bit lines each connected to the drain terminals of the memory cells aligned in a particular column, and a plurality of source conductors each electrically connected only to the source terminals of the memory cells in a particular row. This architecture lends itself to a finer granularity of small blocks without extra memory cell area.

15 Claims, 3 Drawing Sheets

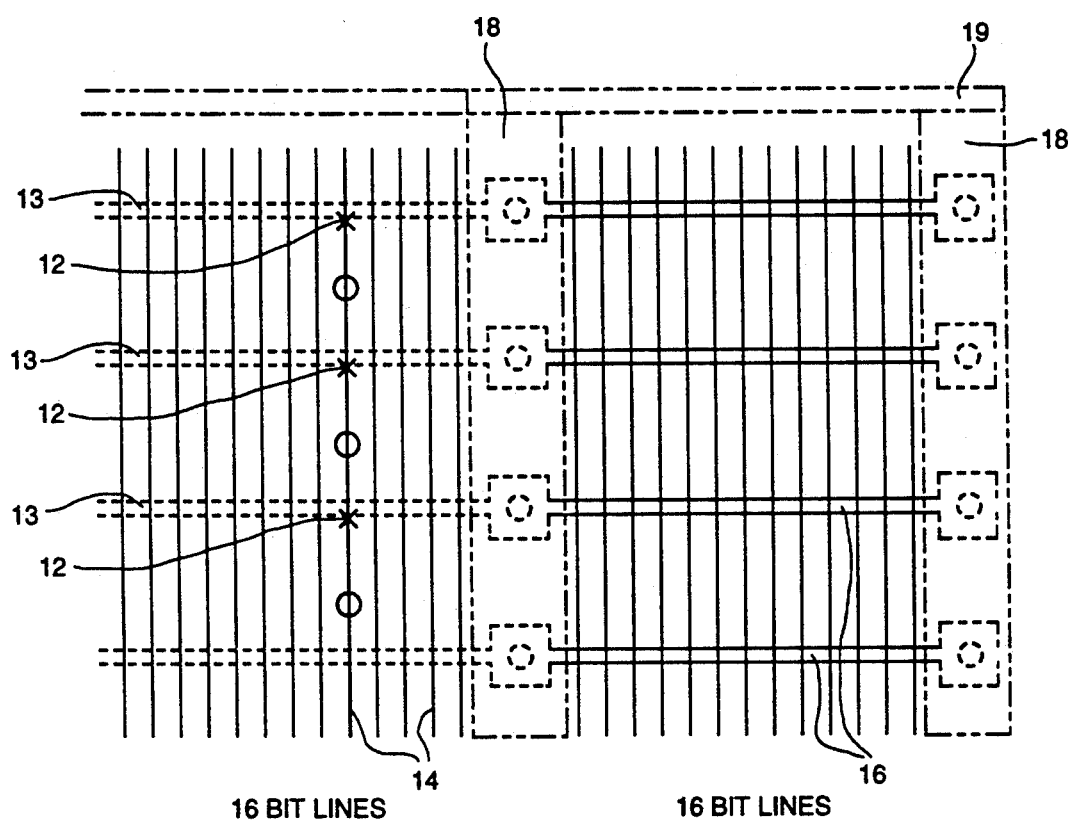
FIG_1
METAL LINE — — — —
WORD LINE - - - - - -

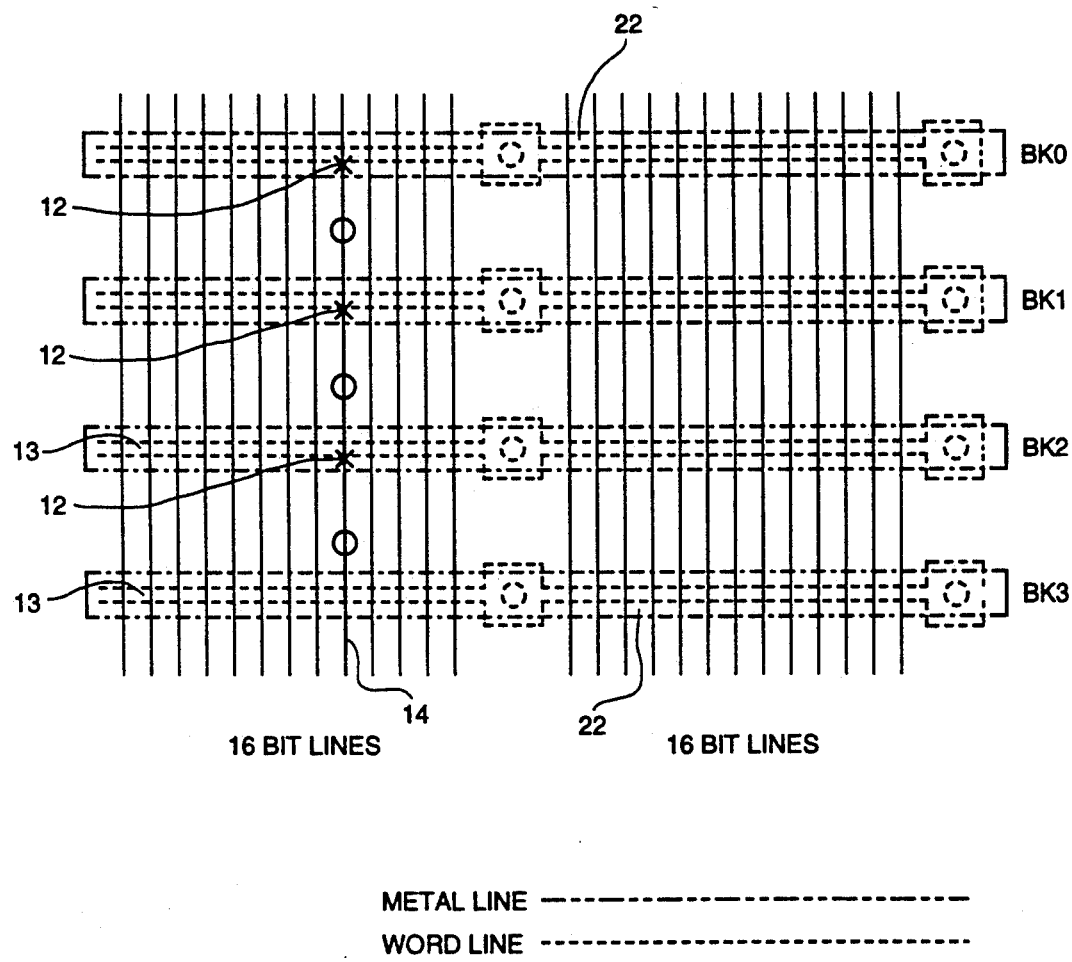
FIG_2

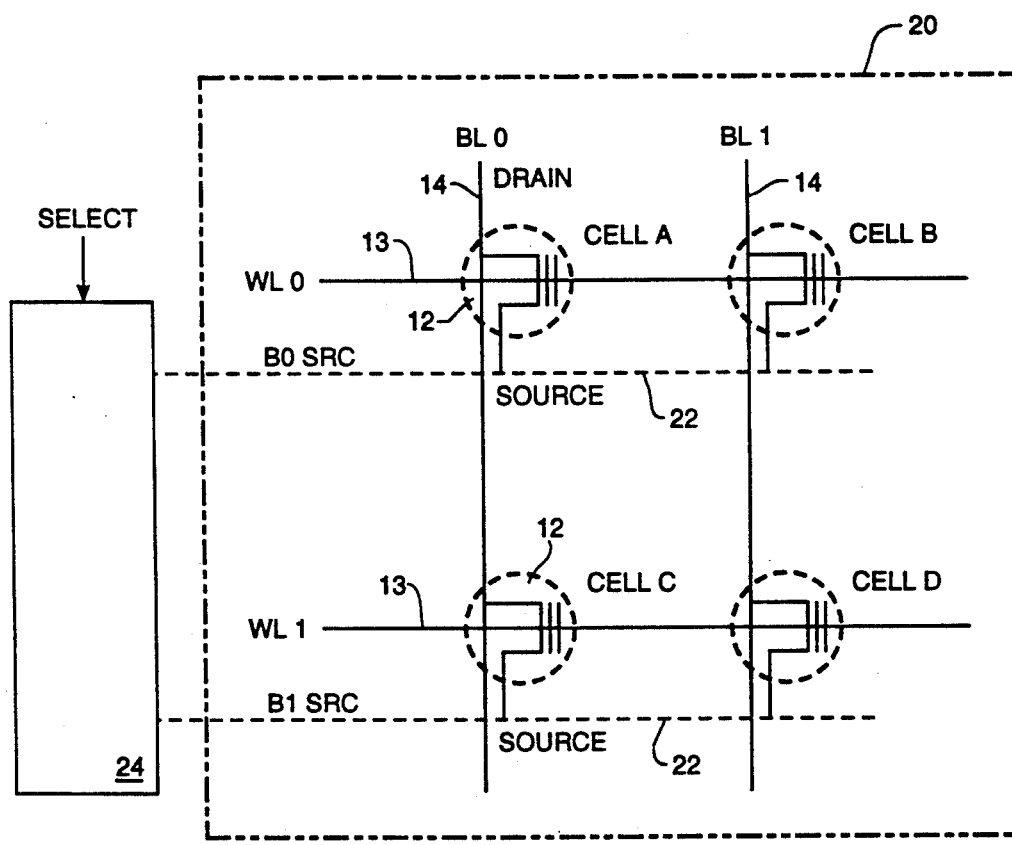
FIG_3

ARCHITECTURE FOR ERASING VERY SMALL AREAS OF FLASH EPROMS

BACKGROUND OF THE INVENTION

1. Field of the Invention

This invention relates to electrically programmable read only memory (EPROM) and, more particularly, to methods and apparatus for erasing small portions of EPROMs using flash techniques.

2. History of the Prior Art

Electrically programmable read only memory (EPROM) has been used for many different purposes. These memories provide a quick and relatively inexpensive way of furnishing read-only memory. These memories are available in arrays up to four megabytes. One unfortunate aspect of such memories is the difficulty of reprogramming. In general, such memories can only be erased by the manufacturer using ultra violet light, and the erasure is of all the data held in memory.

Because it is often desirable to reprogram read only memory and it is also desirable that this be done without the need to return the memory to the manufacturer, advanced forms of EPROMs have been developed. For example, electrically erasable programmable read only memories (EEPROMs) have been developed which allow the read only memory to be erased at the byte level. This facility allows erasure to be done without returning the memory to the manufacturer. It also allows most of the information already in memory to be retained, and only the specific information which needs change to be changed. See, for example, U.S. Pat. No. 4,023,158 for a discussion of such EEPROM cells and U.S. Pat. No. 4,266,283 for a discussion of the related circuitry. These memories, however, are always larger in chip size than are EPROM cells due to the larger cell necessary to implement EEPROM specific functionality. They are available only in sizes up to approximately one megabits.

Recently, a new electrically erasable programmable read only memory called flash EEPROM (FEEPROM) has been devised. Such a memory array is disclosed in U.S. patent application Ser. No. 667,905, entitled *Low Voltage EEPROM Cell*, Lai et al, filed Nov. 2, 1984, and assigned to the assignee of the present invention. FEEPROM may be electrically erased without returning the memory to the manufacturer. FEEPROM is available in memory arrays up to four megabytes. A difficulty with FEEPROM, however, is that it operates by applying a high voltage to the source terminals of all of the transistors (cells) used in the memory. Because these source terminals are all connected by metallic busing in the array, only the entire array may be erased. This requires that the entire board be reprogrammed once it has been erased.

It has been found possible to erase blocks of FEEPROM by physically separating those blocks during chip layout into groups (blocks) of cells which may be erased together. This reduces the reprogramming effort to some extent but it may be used only in a limited manner. The individual blocks of cells must be physically isolated on the silicon in order to allow these blocks to be flash erased separately. The separation requirement significantly increases the size of the silicon chip. Consequently, dividing the array into a finer granularity is almost economically impossible. Because large chips cannot be divided into these blocks, a very substantial amount of useful information (e.g., one-fourth) in memory must be reprogrammed in making any small change in memory.

SUMMARY OF THE INVENTION

It is, therefore, an object of the present invention to provide an improved FEEPROM very small portions of which may be erased electrically.

It is another more specific object of the present invention to provide an improved FEEPROM which may be erased electrically at the level of a single word line.

These and other objects of the present invention are realized in an electrically programmable memory array including a plurality of transistors for storing data aligned in rows and columns, a plurality of word lines each connected to the gate terminals of the transistors in a particular row, a plurality of bit lines each connected to the drain terminals of the transistors aligned in a particular column, and a plurality of source conductors each electrically connected only to the source terminals of the transistors in a particular row.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a top view illustrating a small portion of conventional FEEPROM.

FIG. 2 is a top view illustrating a small portion of FEEPROM constructed in accordance with the present invention.

FIG. 3 is an equivalent circuit diagram illustrating a small portion of FEEPROM constructed in accordance with the present invention.

DETAILED DESCRIPTION OF THE INVENTION

Referring now to FIG. 1, there is shown a small portion of a FEEPROM memory array 10. The memory array 10 includes a number of field effect transistors 12 arranged on a silicon base in a conventional configuration. In FIG. 1, only three transistors (FEEPROM memory cells) 12 are represented, these by small x marks. However, a FEEPROM cell 12 exists at the intersection of each word line 13 (three are illustrated) and each bit line 14 (thirty-two are illustrated). As is well known to those skilled in the art, the word lines are connected to the gate terminals of the individual memory cells 12. The word lines 13 are provided by individual conductors laid on the silicon base or an insulating layer and proceeding horizontally as seen in the figure from left to right. In a like manner, the bit lines 14 are connected to the drain terminals of each cell 12 in conventional FEEPROM arrays. The bit lines 14 are formed of individual conductors laid on the silicon base or an insulating layer and proceeding vertically as seen in the figure from bottom to top.

Also connected to the source terminal of each cell 12 at each intersection of the bit lines 14 and word lines 13 is a source connector 16. As may be seen, each connector 16 parallels the path of an adjacent word line 13 horizontally across the array 10. In order to provide source voltage to each of the cells 12, the connectors 16 are connected to a bus 18 along a series of vertical lines which may separate groups of sixteen bit lines 14. Each of the buses 18 is in turn connected to a source bus 19 by which a single source voltage is applied to all of the cells 12.

In a FEEPROM, a high voltage (e.g., 12 volts) is applied to the source terminals of the cells 12 to erase the datum stored at each cell 12. Since all of the source terminals are connected together, the entire array 10 is erased together. In order to reduce the number of the memory cells 12 being erased, the memory array has been divided into blocks each of which has a separate bus for the source voltage. This allows the individual blocks of the array to be erased. However, the physical separation required to accomplish this so enlarges the size of the silicon chip necessary to hold the array that the array may only be separated into a very few blocks.

FIG. 2 illustrates a small portion of a memory array 20 constructed in accordance with the present invention. In FIG. 2, those elements of the array 20 which are unchanged from those illustrated in FIG. 1 are given the same numbers as are used in FIG. 1. Thus the memory cells 12, the word lines 13, and the bit lines 14 are essentially identical to those in FIG. 1.

The source conductors 22 illustrated in FIG. 2 differ, however, from those in FIG. 1. The source conductors 22 of the array 20 are each connected only to those memory cells 12 connected to a single word line 13. This separate connection of the source conductors 22 to the cells of only a single word line allows the source conductors to be selected individually by conventional selection circuitry. Since the source conductors may be selected individually, in contrast to those of the prior art FEEPROMs, a single word line of cells 12 may receive a voltage on the source line to electrically erase the data held by those cells. FIG. 3 illustrates an equivalent circuit for the transistors 12 of the array 20. It will be seen that the source conductors 22 connect only to the transistors 12 of a single word line 13. As will be understood by those skilled in the art, this allows a very small portion of the array to be selected for flash erasure (128 bytes in a particular arrangement). Consequently, only a very small amount of the array 20 needs to be reprogrammed once that erasure has been accomplished.

It will be recognized that the manufacture of memory arrays such as are illustrated in FIG. 2 must be modified to some extent. First the buses 18 of the conventional array 10 which join the individual source conductors are omitted in the manufacturing process. This allows the isolation of the individual conductors 22 from each other. Moreover, depending on the size of the array 20, the conductors 22 may have to be constructed of a more conductive material such as a metal (rather than a polysilicon as is typical) because of the longer lengths of the conductors without the buses 18. When manufactured of metal, the word lines and the source conductors must be effectively isolated from one another such as by a layer of silicon dioxide. Finally a conventional arrangement 24 for selecting the individual source conductors 22 must be provided.

It will be recognized by those skilled in the art that the present invention allows the selection of very minute portions of a memory array to be selected for flash erasing so that substantial reprogramming is eliminated. Moreover, the amount of the array which may be erased is easily selectable so that one, two, or more word lines of memory cells in the array may be erased at once.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An erasable electrically programmable memory array for minimizing the amount of memory needed to be reprogrammed following erasure, said memory array comprising:
   a plurality of transistors for storing digital information, said transistors aligned in rows and columns, each of said transistors having a gate terminal, a source terminal, and a drain terminal;
   a plurality of bit lines each connected to the drain terminals of the transistors in each column of the memory array;
   a first word line connected to the gate terminals of the transistors in a first row;
   a first source conductor electrically connected to the source terminals of the transistors in the first row;
   a second word line connected to the gate terminals of the transistors in a second row adjacent to the first row; and
   a second source conductor electrically connected to the source terminals of the transistors in the second row, said second source conductor electrically insulated from the first conductor so that the second row may be electrically erased separately from the first row.

2. The memory array of claim 1 wherein the first and the second source conductors comprise a conductive metal.

3. The memory array of claim 2 wherein the memory array further comprises a layer of silicon dioxide positioned between the first and the second source conductors.

4. The memory array of claim 1 further comprising:
   a plurality of word lines each electrically connected to the gate terminals of the transistors in a respective row; and
   a plurality of source conductors each electrically connected to the source terminals of the transistors in a respective row, each of said source conductors electrically insulated from the source conductors for an adjacent row.

5. The memory array of claim 1 wherein each of the plurality of source conductors comprises a conductive metal.

6. The memory array of claim 5 wherein the memory array further comprises a layer of silicon dioxide positioned between each of the plurality of source conductors.

7. A selectively erasable electrically programmable memory array apparatus for storing data and minimizing the amount of memory needed to be reprogrammed following erasure, said memory array apparatus comprising:
   a memory array including
      a plurality of transistors for storing digital information, said transistors aligned in rows and columns, each of said transistors having a gate terminal, a source terminal, and a drain terminal, each of the transistors being erasable by applying an erasing voltage to the respective source terminal;
      a plurality of bit lines each connected to the drain terminals of the transistors in each column of the memory array;

a first word line connected to the gate terminals of the transistors in a first row;

a first source conductor electrically connected to the source terminals of the transistors in the first row;

a second word line connected to the gate terminals of the transistors in a second row adjacent to the first row;

a second source conductor electrically connected to the source terminals of the transistors in the second row, said second source conductor electrically insulated from the first conductor; and a row erasing means including means for selectively applying the erasing voltage to the first source conductor of the array to electrically erase the data stored in the transistors connected to the first source conductor, said row erasing means also including means for selectively applying the erasing voltage to the second source conductor of the array separately from the first source conductor to electrically erase the data stored in the transistors connected to the second source conductor.

8. The memory array apparatus of claim 7 wherein the first and the second source conductors comprise a conductive metal.

9. The memory array apparatus of claim 8 wherein the memory array further comprises a layer of silicon dioxide positioned between the first and the second source conductors.

10. The memory array apparatus of claim 7 further comprising:

a plurality of word lines each electrically connected to the gate terminals of the transistors in a respective row; and a plurality of source conductors each electrically connected to the source terminals of the transistors in a respective row, each of said source conductors electrically insulated from the source conductors for an adjacent row.

11. The memory array apparatus of claim 10 wherein the row erasing means further comprises means for selecting one of the plurality of source conductors, and means for applying the erasing voltage to said individually selected one of the plurality of source conductors of the array to electrically erase the data stored in the transistors connected to said individually selected source conductor.

12. The memory array apparatus of claim 10 wherein the row erasing control means includes means for selecting a selected plurality of source conductors, and means for applying the erasing voltage to said selected plurality of source conductors to electrically erase the data stored in the transistors connected to said selected plurality of source conductors.

13. A selectively erasable electrically programmable memory array apparatus for storing data, said memory array apparatus comprising:

a memory array including a plurality of transistors for storing digital information, said transistors aligned in rows and columns, each of said transistors having a gate terminal, a source terminal, and a drain terminal, each the transistors being erasable by applying an erasing voltage to the respective source terminal;

a plurality of bit lines each connected to the drain terminals of the transistors in each column of the memory array;

a plurality of word lines each electrically connected to the gate terminals of the transistors in a respective row;

a plurality of source conductors each electrically connected to the source terminals of the transistors in a respective row, each of said source conductors comprising a conductive metal electrically insulated from the source conductors of the adjacent rows; and a row erasing control means for selecting an individually selected source conductor, and for applying the erasing voltage to said individually selected source conductor of the array to electrically erase the data stored in the transistors connected to said individually selected source conductor.

14. The memory array apparatus of claim 13 wherein the row erasing control means includes means for selecting a plurality of source conductors, and means for applying the erasing voltage to said selected plurality of source conductors to electrically erase the data stored in the transistors connected to said selected plurality of source conductors.

15. The memory array of claim 13 wherein the memory array further comprises a layer of silicon dioxide positioned between the first and the second source conductors.

* * * * *